United States Patent
Kim

(10) Patent No.: US 7,056,790 B2
(45) Date of Patent: Jun. 6, 2006

(54) DRAM CELL HAVING MOS CAPACITOR AND METHOD FOR MANUFACTURING THE SAME

(75) Inventor: Hak-yun Kim, Chungcheongbuk-do (KR)

(73) Assignee: Icheon-shi (KR)

( * ) Notice: Subject to any disclaimer, the term of this patent is extended or adjusted under 35 U.S.C. 154(b) by 50 days.

(21) Appl. No.: 10/737,052

(22) Filed: Dec. 16, 2003

(65) Prior Publication Data

US 2004/0126970 A1     Jul. 1, 2004

(30) Foreign Application Priority Data

Dec. 16, 2002   (KR) .................. 10-2002-0080298

(51) Int. Cl.
*H01L 21/336*    (2006.01)
(52) U.S. Cl. ........................ 438/257; 438/243
(58) Field of Classification Search .......... 438/257, 438/243; 257/301
See application file for complete search history.

(56) References Cited

U.S. PATENT DOCUMENTS

| | | | | |
|---|---|---|---|---|
| 5,895,946 | A * | 4/1999 | Hamamoto et al. ......... | 257/302 |
| 5,910,667 | A * | 6/1999 | Hsu ........................... | 257/306 |
| 6,087,212 | A | 7/2000 | Hirota | |
| 6,172,898 | B1 * | 1/2001 | Kajiyama ................... | 365/149 |
| 6,509,244 | B1 | 1/2003 | Kim et al. | |

* cited by examiner

*Primary Examiner*—Thao P. Le
(74) *Attorney, Agent, or Firm*—Marshall, Gerstein & Borun LLP

(57) ABSTRACT

A DRAM cell having a MOS capacitor and a method for manufacturing the same are disclosed. The DRAM cell includes: an active region of a semiconductor substrate; a MOS capacitor consisting of a plate node electrode which is a part of the active region, a storage node electrode having a T-shaped structure through a trench of the active region and an insulator thin film formed between the plate node electrode and the storage node electrode; a cell transistor having a gate insulating film and a gate electrode which are formed on the top surface of the active region and a source/drain formed within the active region; an interlayer insulating film deposited on a structure with the MOS capacitor and the cell transistor; a contact electrode connected with the source/drain of the cell transistor or with the storage node electrode of the MOS capacitor through a contact hole of the interlayer insulating film; a wire connected with the drain and the storage node electrode through the contact electrode; and a bit line connected with the source through the contact electrode.

7 Claims, 5 Drawing Sheets

DRAM CELL HAVING MOS CAPACITOR AND METHOD FOR MANUFACTURING THE SAME

BACKGROUND

1. Technical Field

A DRAM cell and a method for manufacturing the same are disclosed. More particularly, a DRAM cell having a MOS capacitor and a method for manufacturing the same are disclosed, which are suitable for electronic apparatuses such as a CD-R/W or game apparatus requiring a smaller memory capacity.

2. Description of the Related Art

Generally, a semiconductor memory device denotes a device capable of storing data and reading it when necessary. It includes various kinds of semiconductor memory devices such as a DRAM (Dynamic Random Access Memory)-based semiconductor memory, a magnetic disc, an optical disc and so on. Semiconductor memories have many advantages including compactness, high reliability, the ability to be produced at low cost and high speed operation. Thus, they are being widely used in the form of a main memory for computers, buried type memories in a microprocessor and a cash memory.

A unit cell structure of a DRAM includes a word line driven by a row address, a bit line driven by a column address, a cell transistor having a drain connected to the bit line and a gate connected to the word line and a capacitor connected to the source of the cell transistor.

The reading/writing of such a DRAM cell is as follows. When a certain word line is activated, the cell transistor connected to the corresponding word line is turned on. As voltage of the bit line is applied through the drain of the cell transistor, a charge is stored in the storage node electrode of the capacitor. At that time, as the voltage applied to the bit line, either a OV (operating voltage) or a Vdd (driving voltage) is supplied. And a fixed power voltage is supplied to the plate node electrode of the capacitor, usually half the driving voltage (Vdd).

In the case of MOS (Metal-Oxide-Silicon) capacitor used in the DRAM cell, there is an advantage over a general stacked capacitor in that a logic process can be used as it is.

FIG. 1 is a vertical sectional view showing a prior art DRAM cell structure having a MOS capacitor. Referring to FIG. 1, a vertical section structure of the DRAM cell includes a semiconductor substrate 10, a well 12, a device isolation film 14, a gate insulating film 16 deposited on the whole surface of the substrate, a gate electrode 18 of a cell transistor 3 and a plate node electrode 20 of a MOS capacitor 4 each being formed on top of the gate insulating film 16, a source/drain 24 of the cell transistor 3 formed in the substrate and a bit line 30 connected to the source/drain 24 through a contact electrode 28 of an interlayer insulating film 26.

In FIG. 1, the storage node electrode of the MOS capacitor 4 is the well 12 region located below the plate node electrode 20 and the insulator film between these electrodes 20, 12 becomes the gate insulating film 16. The gate electrode 18 of the cell transistor 3 is used as a word line.

A signal discharge of the DRAM cell of FIG. 1 is stored in the well 12, which is the storage node of the MOS capacitor 4 connected to the source of the cell transistor 3. The DRAM cell having the MOS capacitor 4 of FIG. 1 has an advantage over a stacked capacitor in that a logic process can be used as is. However, it is problematic in that data is stored in the well 12 which used as the storage node and thus a lot of leakage current results thereby reducing the refresh time.

SUMMARY OF THE DISCLOSURE

A DRAM cell having a MOS capacitor is disclosed which is capable of increasing the capacity of the MOS capacitor and preventing current leakage that may occur when a storage node electrode is used as an active region. The disclosed DRAM cell uses a plate node electrode as an active region of a substrate and a storage node electrode with a T-shaped conductive pattern.

A method for manufacturing a DRAM cell having a MOS capacitor is also disclosed which is capable of increasing the capacity of the MOS capacitor and preventing or reducing current loss by using a plate node electrode of the MOS capacitor as the active region of a substrate and forming a T-shaped storage node electrode on a trench in the substrate.

A disclosed DRAM cell having a cell transistor and a capacitor comprises: a word line driven by a row address; a bit line driven by a column address; a cell transistor having a source connected to the bit line and a gate electrode connected to the word line; and a MOS capacitor having a storage node electrode connected to a drain of the cell transistor, a plate node electrode formed on an active region of a semiconductor substrate and an insulator thin film formed between the storage node electrode and the plate node electrode.

Another disclosed DRAM cell comprises: an active region of a semiconductor substrate; a MOS capacitor consisting of a plate node electrode which is a part of the active region, a storage node electrode having a T-shaped structure through a trench of the active region and an insulator thin film formed between the plate node electrode and the storage node electrode; a cell transistor having a gate insulating film and a gate electrode which are formed on the top surface of the active region and a source/drain formed within the active region; an interlayer insulating film deposited on a structure with the MOS capacitor and the cell transistor; a contact electrode connected with the source/drain of the cell transistor or with the storage node electrode of the MOS capacitor through a contact hole of the interlayer insulating film; a wire connected with the drain and the storage node electrode through the contact electrode; and a bit line connected with the source through the contact electrode.

A disclosed method for manufacturing a DRAM cell having a cell transistor and a capacitor comprises: forming a trench on parts of an active region of a semiconductor substrate; implanting impurities into the active region; forming an insulator thin film and a gate insulating film simultaneously on the entire surface of the substrate with the trench; forming a storage node electrode having a T-shaped structure and a gate electrode of the cell transistor simultaneously by depositing a conductive film on the resulting material so that the trench is buried and patterned the same; forming a source/drain of the cell transistor by implanting impurities into the resulting material; forming a contact electrode connected with the source/drain of the cell transistor or with the storage node electrode of the MOS capacitor by forming an interlayer insulating film on the whole surface of the resulting material, forming a contact hole on the interlayer insulating film and then burying the conductive film into the contact hole; and forming a wire connected with the drain and the storage node electrode and a bit line connected with the source through the contact electrode by depositing a conductive film on top of the interlayer insulating film and patterning the same.

BRIEF DESCRIPTION OF THE DRAWINGS

Other aspects of the disclosed DRAM cell and manufacturing methods will become apparent from the following description of embodiments with reference to the accompanying drawing wherein.

DESCRIPTION OF THE PRESENTLY PREFERRED EMBODIMENTS

Figure 1:
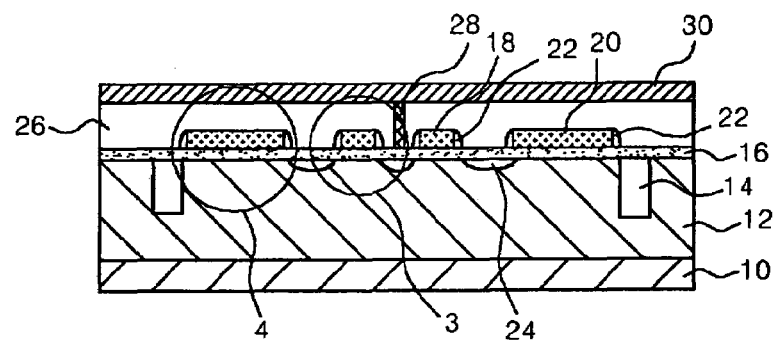
FIG. 1 is a vertical sectional view showing a prior art DRAM cell structure having a MOS capacitor.
Figure 2:
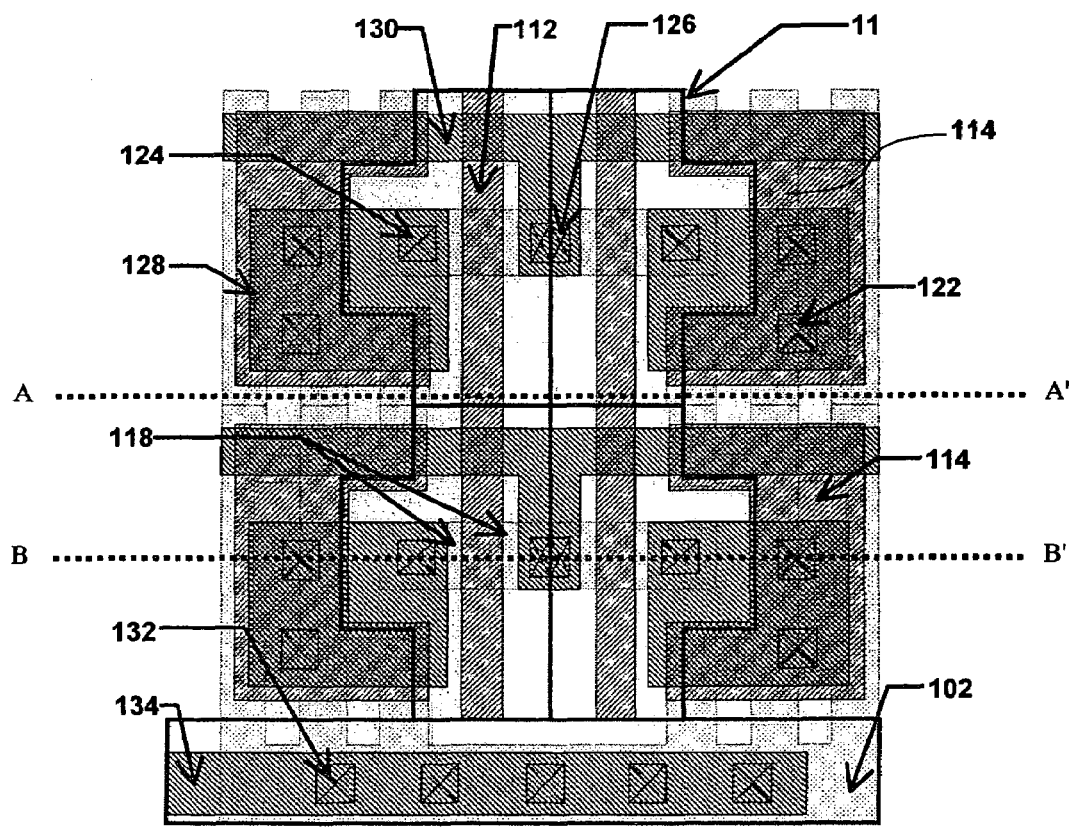
FIG. 2 is a layout view of a DRAM cell having a MOS capacitor in accordance with this disclosure.

FIG. 2 is a layout view of a disclosed DRAM cell having a MOS capacitor. Referring to FIG. 2, the disclosed DRAM cell layout includes a word line (gate electrode) 112 driven by a row address, a bit line 130 driven by a column address and a cell transistor having a source 118 connected to the bit line 113 and a gate electrode 112 connected to the word line. Also, a storage node electrode 114 is connected to a drain 118 of the cell transistor. Moreover, in the disclosed DRAM cell, a well 102, which is the active region of a semiconductor substrate, is used as a plate node electrode to constitute the MOS capacitor. A power line 134 is connected to the plate node electrode, which is the well 102 for supplying a power voltage via a contact electrode 132.

In FIG. 2, reference numerals 122, 124 and 126 denote contact electrodes. Reference numeral 11 denotes a mask region used when removing a film filled in the lower part of a trench upon the formation of a trench of the MOS capacitor 4' as shown in FIG. 4.

In the disclosed DRAM cell, the MOS capacitor 4' uses the plate node electrode receiving a power voltage as the well 102 and uses the storage node electrode 114 storing a signal charge as a conductive film of the top of an active region. Using this configuration, the loss of a leakage current flowing on the substrate in read/write operations is reduced and a data access time is shortened as compared to when the storage node electrode is used as an active region.

Figure 3:
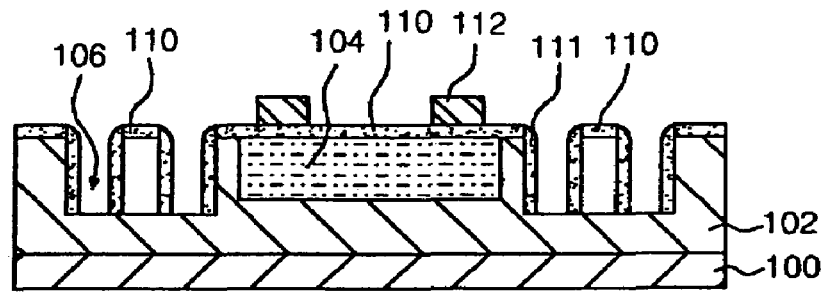
FIG. 3 is a vertical sectional view taken along line A–A' in FIG. 2.

FIG. 3 is a sectional view taken along line A–A' in FIG. 2. FIG. 4 is a sectional view taken along line B–B' in FIG. 2. Referring to these drawings, a vertical sectional view of the disclosed DRAM cell is as follows.

Figure 4:
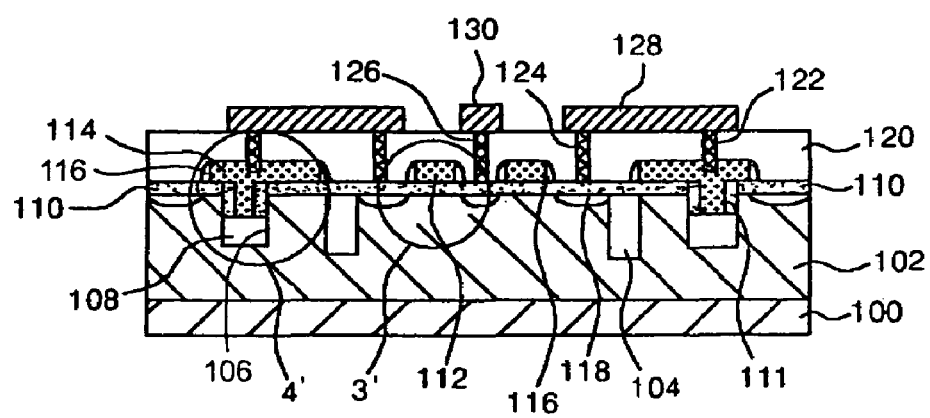
FIG. 4 is a vertical sectional view taken along line B–B' in FIG. 2.

Refering to FIGS. 2 and 4, the MOS capacitor 4' includes a well 102 which is an active region of a semiconductor substrate 100, a storage node electrode 114 having a T-shaped structure through a trench 106 (see also FIG. 5B) of the active region 102 and insulator thin films 110 and 111 between a plate node electrode (see the well 102) and a storage node electrode 114. The cell transistor 3' includes a gate insulating film 110 and a gate electrode 112 formed on the top surface of the active region and a source/drain 118 formed in the active region. In addition, an interlayer insulating film 120 is deposited on the structure with the MOS capacitor 4' and the cell transistor 3'. Contact electrodes 122, 124 and 126 are connected to the source/drain 118 of the cell transistor 3 or to the storage node electrode 114 of the MOS capacitor 4' through a contact hole of the interlayer insulating film 120. A wire 128 is connected to the drain and the storage node electrode 114 through the contact electrodes 122 and 124. A bit line 130 is connected to the source through the other contact electrode 126. A trench and device isolation film is shown at 104.

In the disclosed DRAM cell, the MOS capacitor 4' further includes a gap-fill layer 108 filling the lower part of the trench 106 with an insulating material. At this time, a mask 11 of FIG. 2 is used in order to leave the gap-fill layer 108 only in the trench 106. Additionally, a side wall spacer 116 made of an insulating material is formed on the side walls of the storage node electrode 114 of the MOS capacitor 4' and on the side walls of the gate electrode 112 of the cell transistor 3', thereby insulating the side faces of the structure.

As shown in FIGS. 3 and 4, the storage node electrode 114 of the disclosed MOS capacitor 4' is composed of curved trenches 106 joined together by at least one linking trench whose lower film is buried, and the MOS capacitor 4' can acquire a higher capacitance than a stacked MOS capacitor.

In the disclosed DRAM cell having the above structure, when a data signal is supplied to the bit line 130 in the write operation, a high level voltage is supplied to the gate electrode 112 which is the word line, the cell transistor 3' is activated. A signal charge is stored in the storage node electrode 114 of the MOS capacitor via the source/drain 118 of the cell transistor 3'.

On the contrary, when a high level voltage is supplied to the gate electrode 112 which is the word line in the read operation, the cell transistor 3' is turned on, and, the signal charge stored in the storage node electrode 114 is transferred to the bit line 130 from the source/drain.

FIGS. 5a to 5i are flow diagrams sequentially showing a process for manufacturing a DRAM cell having a MOS capacitor in accordance with a first disclosed embodiment. In this embodiment, the DRAM cell manufacturing process will be explained with priority given on a process for manufacturing a MOS capacitor 4'.

Figure 5A:
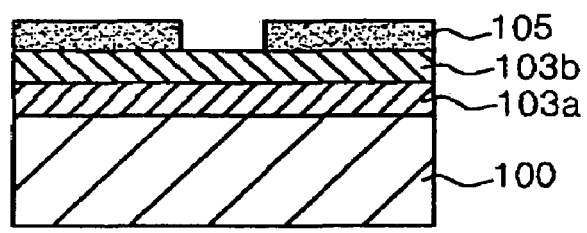
FIGS. 5a to 5i are flow diagrams sequentially showing a process for manufacturing a DRAM cell having a MOS capacitor in accordance with a disclosed embodiment.

First, as shown in FIG. 5a, a pad oxide film 103a and a hard mask film 103b are sequentially stacked on a silicon substrate acting as a semiconductor substrate 100, and a photoresist pattern 105 defining a MOS capacitor 4' trench region is formed thereon.

Figure 5B:
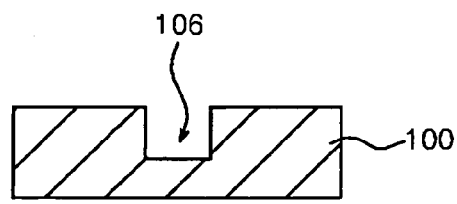

And, a trench 106 as shown in FIG. 5b is formed by patterning the hard mask film 103b and the pad oxide film 103a and etching the substrate 100 to a predetermined thickness by a dry etching process using the photoresist pattern 105. Then, the photoresist pattern 105, the hard mask film 103b and the pad oxide film 103a are removed. At this point, the trench 106 of the MOS capacitor 4' comprises curved trenches joined together by at least one linking trench, thereby increasing the capacitor capacitance.

Figure 5C:
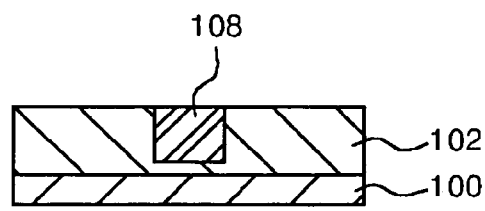

Subsequently, as shown in FIG. 5c, a HLD (high temperature low pressure dielectric) film is deposited as a gap-fill layer 108 on the resulting material and is flattened, thereby burying the trench 106 in insulating material shown at 108. During such a process for manufacturing a trench and a gap-fill layer 108, a process for manufacturing a device isolation film of the DRAM cell, and the gap-fill layer can be carried out simultaneously.

Still returning to FIG. 5c, an impurity implantation process, for example, a p-well process, is carried out into the semiconductor substrate 100 to thereby form a well 102 which is an active region of the cell in the substrate and is used as the plate node electrode of the MOS capacitor 4'.

And, additional impurity ions are implanted into the substrate by performing an n-channel process, a threshold voltage control and so on into the well 102.

Meanwhile, the gap-fill layer 108 buried in the trench 106 of the MOS capacitor region is buried down to the top surface of the trench or a predetermined portion thereof. But, preferably, the gap-fill layer 108 is buried down to the predetermined portion of the trench 106 in order to increase the capacitance of the MOS capacitor 4'.

Figure 5D:
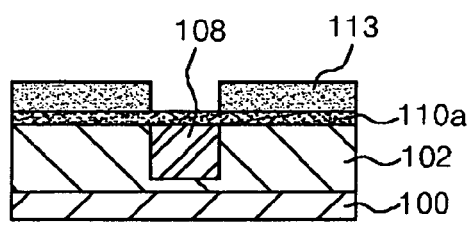
Figure 5E:
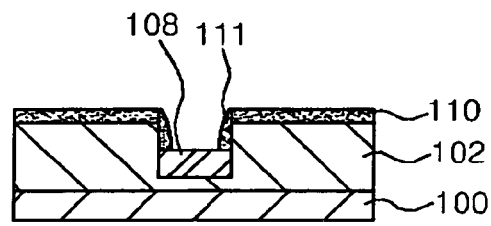

Specifically as shown in FIG. 5d, an insulator thin film 110a is deposited on the whole surface of the semiconductor substrate 100, and a photoresist pattern 113 opening the trench region of the MOS capacitor 4' is formed thereon. Then, the insulator thin film 110a disposed on top of the gap-fill layer 108 and exposed by the photoresist pattern 113 is etched and removed. Thereafter, the photoresist pattern 113 is removed as shown in FIG. 5. At this time, though not shown in the drawings, the photoresist pattern 113 defines the MOS capacitor 4' region and the gate insulating film region of the cell transistor as well as the trench region. In the etching process using the photoresist pattern 113 as a mask, the insulator thin film of the MOS capacitor 4' and the gate insulating film can be patterned together. Accordingly, as shown in FIG. 5e, the insulator thin film 110 of the MOS capacitor 4' and the gate insulating film (not shown) of the cell transistor are patterned.

Subsequently, the exposed gap-fill layer 108 is selectively etched to fill parts of the trench and thereafter a side wall spacer 111 made of an insulating material is formed on the side walls of the trench. At this time, the side wall spacer is used as the insulator thin film of the MOS capacitor 4'.

Figure 5F:
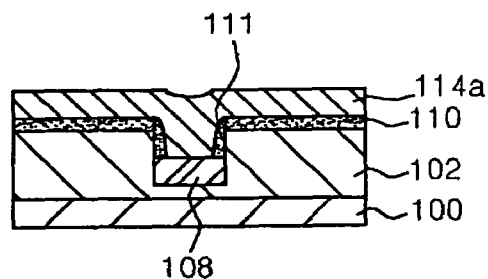
Figure 5G:
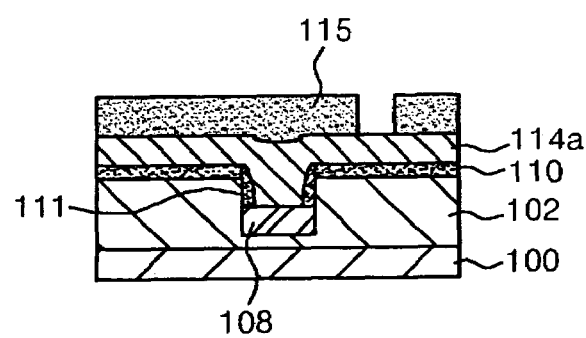

Continually, as shown in FIG. 5f, a polysilicon layer is deposited on the resulting material as a conductive film 114a in such a manner that a partial thickness remains on top of the insulator thin film 110 of the MOS capacitor and on top of the gate insulating film. As shown in FIG. 5g, a photoresist pattern 115 defining the storage node electrode of the MOS capacitor 4' and the gate electrode region of the cell transistor is formed on top of the conductive film 114a.

Figure 5H:
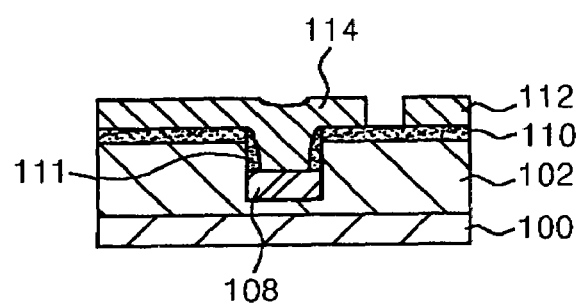

Subsequently, the conductive film 114a exposed by the photoresist pattern 115 is dry etched to thus form a storage node electrode 114 of the MOS capacitor 4' having a T-shaped structure as shown in FIG. 5h and at the same time form a gate electrode 112 of the cell transistor 3'. Then, the photoresist pattern 115 is removed (See FIG. 5h).

Figure 5I:
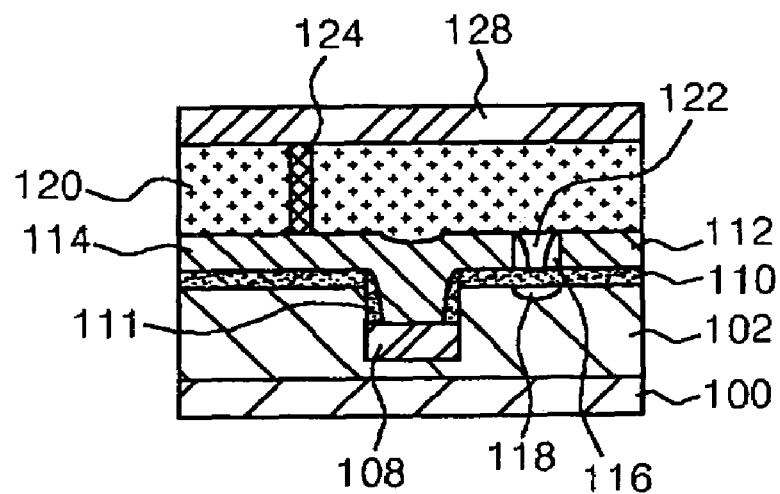

Next, as shown in FIG. 5i, an insulating film is deposited on the resulting material and then is dry etched to form the side wall spacer 116 on the side walls of the storage node electrode 114 of the MOS capacitor 4' (see also FIG. 4) and on the side walls of the gate electrode 112 of the cell transistor 3'. And, a source/drain 118 of the cell transistor is formed by implanting impurities using the side wall spacer as a mask. Then, an interlayer insulating film 120 is formed on the whole surface of the resulting material and is subsequently flattened. A contact hole is then formed on the interlayer insulating film 120 and then a conductive film is buried into the contact hole, thereby forming contact electrodes 122 and 124 connected with the source/drain 118 of the cell transistor 3' or with the storage node electrode 114 of the MOS capacitor 4'.

Continually, a conductive film is deposited on the interlayer insulating film 120 and is patterned to form a wire 128 connected to the drain 118 and the storage node electrode 114 via the contact electrodes 122 and 124, and at the same time, to form a bit line (not shown) connected with the source 118 of the cell transistor via another contact electrodes (not shown).

Meanwhile, though not shown in FIG. 5i, a power line is formed in the process of manufacturing the wire 128 and the bit line, which supplies a power voltage to the well 102, which is the plate node electrode, via still another contact electrodes 122, 124 of the interlayer insulating film 120.

As described above, the plate node electrode for receiving power is used as an active region of a substrate which is large in parasitic resistance and capacitance, i.e., a well, in the DRAM cell using the MOS capacitor, thereby improving the signal speed.

In addition, the storage node electrode of the MOS capacitor is used as a conductive film of the top portion of an active region, thereby preventing a leakage current loss that may occur when the storage node electrode is used as an active region in a conventional DRAM cell and reducing the read/write time of the cell.

Moreover, the trench is formed on the MOS capacitor region and thus the storage node electrode of a T-shaped structure is manufactured, thereby increasing a MOS capacitor capacitance.

Further, a logic process can be used as it is, thereby reducing a process time.

It is to be understood that the above description is intended to be illustrative and not restrictive. Many variations will become apparent to those skilled in the art without departing from the spirit and scope of this disclosure.

What is claimed is:

1. A method for manufacturing a DRAM cell, the method comprising:

forming a trench in an active region of a semiconductor substrate;

implanting impurities into the active region;

forming an insulator thin film and a gate insulating film simultaneously on the substrate and the trench;

forming a storage node electrode of a MOS capacitor having a T-shaped structure and a gate electrode of a cell transistor simultaneously by depositing a conductive film on the insulator thin film and the trench to bury the trench and then patterning the conductive film;

forming a source/drain of the cell transistor by implanting impurities into the resulting material;

forming a contact electrode connected to the source/drain of the cell transistor or to the storage node electrode of the MOS capacitor by forming an interlayer insulating film on the whole surface of the resulting material, forming a contact hole on the interlayer insulating film and then burying the conductive film into the contact hole; and forming a wire connected with the drain and the storage node electrode and a bit line connected with the source through the contact electrode by depositing a conductive film on top of the interlayer insulating film and patterning the same.

2. The method of claim 1, wherein the trench of the MOS capacitor comprises a plurality of curved trenches joined together by at least one linking trench.

3. The method of claim 1, wherein a gap-fill layer is further formed for filling the lower part of the trench with an insulating material before implanting impurities into the active region.

4. The method of claim 3, wherein the gap-fill layer is formed on the trench of the storage node region of the MOS capacitor or on the trench of the device isolation region of the semiconductor substrate.

5. The method of claim 4, wherein the gap-fill layer formed on the trench of the storage node region of the MOS capacitor is buried down to a top surface of the trench or a predetermined portion thereof.

6. The method of claim 1, wherein a side wall spacer is additionally formed on the side walls of the storage node electrode of the MOS capacitor and on the side walls of the gate electrode of the cell transistor before the forming the source/drain of the cell transistor.

7. The method of claim 1, wherein a power line is additionally formed for supplying a power voltage to the plate node electrode via another contact electrode of the interlayer insulating film during the step of depositing a conductive film on top of the interlayer insulating film and patterning the same.

* * * * *